United States Patent
Ahn et al.

(10) Patent No.: US 8,819,506 B2
(45) Date of Patent: *Aug. 26, 2014

(54) TARGET DEVICE PROVIDING DEBUGGING FUNCTION AND TEST SYSTEM COMPRISING THE SAME

(71) Applicant: Samsung Electronics Co., Ltd., Suwon-si (KR)

(72) Inventors: Hyunsun Ahn, Seoul (KR); Jaegon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/047,304

(22) Filed: Oct. 7, 2013

(65) Prior Publication Data

US 2014/0068331 A1    Mar. 6, 2014

Related U.S. Application Data

(63) Continuation of application No. 13/079,992, filed on Apr. 5, 2011, now Pat. No. 8,555,120.

(30) Foreign Application Priority Data

Apr. 30, 2010    (KR) .................. 10-2010-0040918

(51) Int. Cl.
    *G01R 31/28*    (2006.01)

(52) U.S. Cl.
    USPC .......................................... 714/724

(58) Field of Classification Search
    USPC .......................................... 714/724
    See application file for complete search history.

(56) References Cited

U.S. PATENT DOCUMENTS

| 7,536,597 | B2 | 5/2009 | McGowan |
| 7,558,984 | B2 | 7/2009 | McGowan |
| 2007/0226558 | A1* | 9/2007 | Ikeda et al. ............ 714/724 |

FOREIGN PATENT DOCUMENTS

| JP | 2002-366378 A | 12/2002 |
| KR | 10-2002-0079162 A | 10/2002 |

* cited by examiner

*Primary Examiner* — Sam Rizk
(74) *Attorney, Agent, or Firm* — Lee & Morse, P.C.

(57) ABSTRACT

A test system for debugging a target device includes a switch unit configured to transfer a test signal to the target device, the target device including a first intellectual property (IP) block supporting a debugging operation at a normal mode and a second IP block supporting a debugging operation at a power saving mode. The switch unit is configured to form a first signal transfer path for transferring the test signal to the first IP block at the normal mode and to form a second signal transfer path for transferring the test signal to the second IP block at the power saving mode.

28 Claims, 8 Drawing Sheets

TARGET DEVICE PROVIDING DEBUGGING FUNCTION AND TEST SYSTEM COMPRISING THE SAME

CROSS-REFERENCE TO RELATED APPLICATIONS

This is a continuation application based on pending application Ser. No. 13/079,992, filed Apr. 5, 2011, the entire contents of which is hereby incorporated by reference.

This application claims the benefits, under 35 U.S.C. §119, of Korean Patent Application No. 10-2010-0040918 filed Apr. 30, 2010, the entirety of which is incorporated by reference herein.

BACKGROUND

1. Field

Exemplary embodiments relate to a test system, and more particularly, to a target device supporting a debugging function and a test system including the same.

2. Description of the Related Art

In general, semiconductor integrated circuits may be inevitably debugged during a design process. The debugging means correcting a design circuit of a semiconductor integrated circuit when no design circuit is normally operated. A semiconductor integrated circuit to be debugged is called a target device. The debugging for error correction is inevitably made if a System on Chip (SoC) scheme is applied to the target device.

Recently, there is an increasing need for a low-power semiconductor integrated circuit. Therefore, a power saving mode for reducing power consumption of the semiconductor integrated circuit may be required.

SUMMARY

Embodiments are therefore directed to a target device supporting a debugging function and a test system including the same, which substantially overcome one or more of the problems due to the limitations and disadvantages of the related art.

At least one of the above and other features and advantages may be realized by providing a test system for debugging a target device, including a switch unit configured to transfer a test signal to the target device, the target device including a first intellectual property (IP) block supporting a debugging operation at a normal mode and a second IP block supporting a debugging operation at a power saving mode, wherein the switch unit may be configured to form a first signal transfer path for transferring the test signal to the first IP block at the normal mode and to form a second signal transfer path for transferring the test signal to the second IP block at the power saving mode.

The first IP block may include at least one processor, the first IP block being configured not to be powered at the power saving mode. The first IP block may further include a first test controller for controlling the debugging operation at the normal mode, the second IP block including a second test controller for controlling the debugging operation at the power saving mode. The switch unit may be within the target device. The target device may include an input/output terminal configured to input and output the test signal, and the switch unit may be configured to form the first signal transfer path between the input/output terminal and the first test controller at the normal mode and to form the second signal transfer path between the input/output terminal and the second test controller at the power saving mode. The test system may further include a test interface connected to the input/output terminal, the test interface being configured to convert an externally provided signal into the test signal. The test signal may be at least one of JTAG signals, I2C signals, and SPI signals. The input/output terminal may be connected to a host which includes a debugging program. The test signal may be an UART signal.

The switch unit may be external to the target device. The target device may include a first input/output terminal connected to the first IP block and to the switch unit at the normal mode to interface the test signal, and a second input/output terminal connected to the second IP block and to the switch unit at the power saving mode to interface the test signal. The first signal transfer path may be formed between the first input/output terminal and the first test controller at the normal mode, and the second signal transfer path is formed between the second input/output terminal and the second test controller at the power saving mode. The test system may further include a test interface connected to the switch unit, the test interface being configured to convert an externally provided signal to the test signal, the switch unit being placed between the test interface and the target device. The test system may further include a test interface connected to the target device, the test interface being configured to convert an externally provided signal to the test signal, the switch unit being placed within the test interface. The switch unit may be connected with a host which includes a debugging program.

At least one of the above and other features and advantages may also be realized by providing a target device for supporting a debug function, including a processor block including at least one processor, the processor block being configured to be powered at a normal mode to support a debugging operation, an alive block configured to be powered at a power saving mode to support a debugging operation, and a switch block configured to form a first signal transfer path into the processor block at the normal mode and to form a second signal transfer path into the alive block at the power saving mode.

The processor block may not be powered at the power saving mode. The processor block may include a first test controller for controlling the debugging operation of the normal mode, and the alive block may include a second test controller for controlling the debugging operation of the power saving mode. The target device may further include an input/output terminal for interfacing a test signal, the first signal transfer path being formed between the input/output terminal and the first test controller and the second signal transfer path being formed between the input/output terminal and the second test controller. The second test controller may be configured to control a state machine analyzing test, a state analyzing test for a system control signal, or a wake-up signal applying test.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
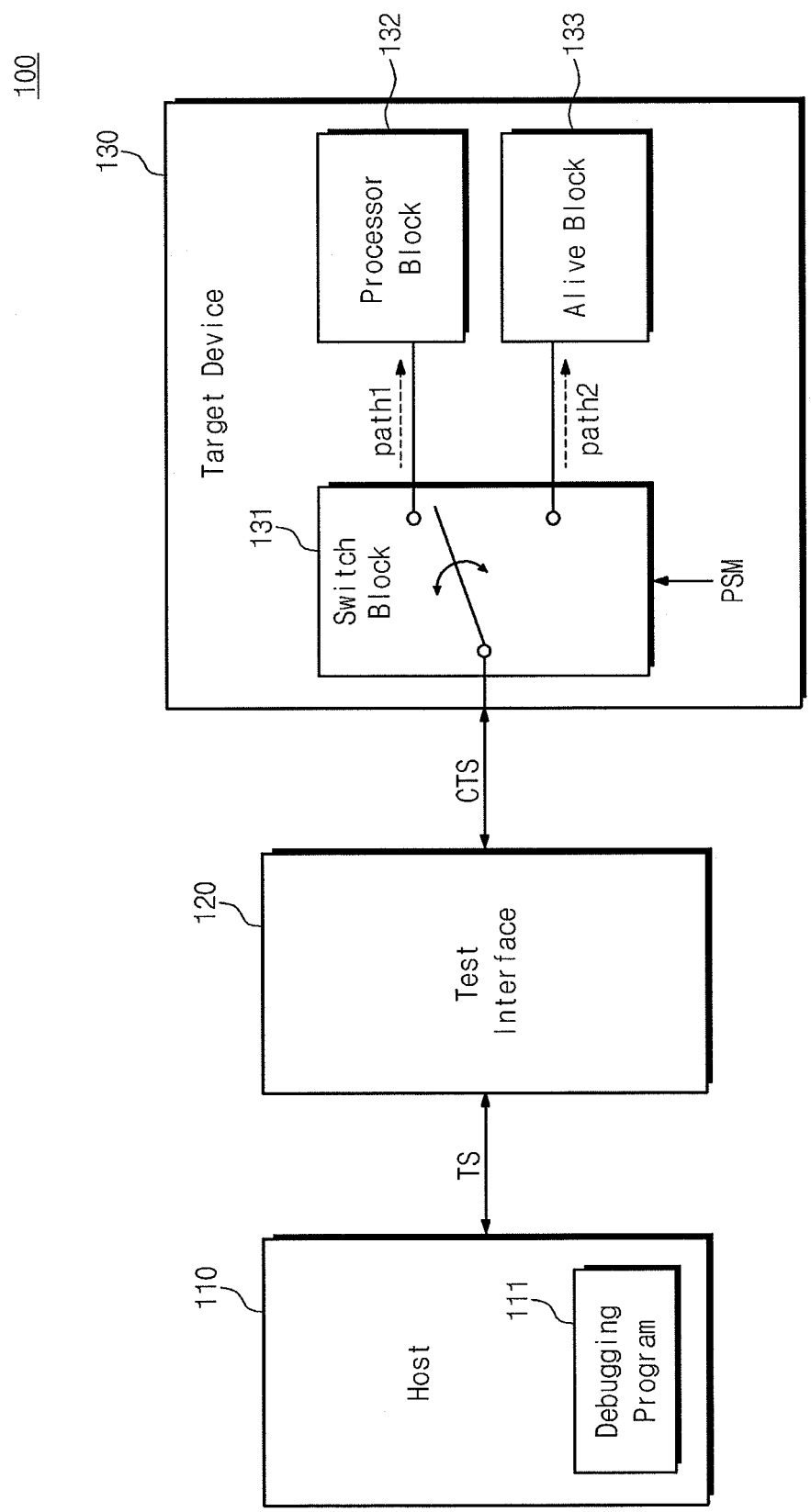
FIG. 1 illustrates a block diagram of a test system according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a block diagram of a test system according to an exemplary embodiment of the inventive concept.

Referring to FIG. 1, a test system 100 may include a host 110, a test interface 120, and a target device 130.

The host 110 may include a debugging program 111 for testing the target device 130. For example, the host 110 may be a computer system, e.g., a personal computer. The host 110 may issue into the test interface 120 a test signal TS for testing the target device 130. For example, in response to an input of a user to issue the test signal TS including an address, a control signal, a data signal, etc., the host 110 may respond into the test interface 120 according to a given protocol. In this case, the protocol may be defined variously by system designers.

The test interface 120 receives the test signal TS from the host 110. The test interface 120 converts the received test signal TS into a converted test signal CTS, which is sent to the target device 130. For example, in the event that JTAG (Joint Test Action Group) signals are used to debug the target device 130, the test interface 120 converts the test signal TS into JTAG signals, e.g., a test mode selection signal TMS, a test clock signal TCK, and a test data input signal TDI, and the JTAG signals are sent to the target device 130.

Further, the test interface 120 may receive a converted test signal CTS from the target device 130, and may convert the received signal CTS into a test signal TS to be returned to the host 110. For example, in the event that JTAG signals are used to debug the target device 130, the test interface 120 receives the JTAG signal, e.g., a test data output signal TDO, from the target device 130 and converts the test data output signal TDO, i.e., a converted test signal CTS, into a test signal TS to be send to the host 110.

The target device 130 may receive the converted test signal CTS from the test interface 120, and may perform a test operation for debugging in response to the converted test signal CTS. For example, in the event that JTAG signals are used to debug the target device 130, the target device 130 receives the JTAG signals, e.g., the test mode selection signal TMS, the test clock signal TCK, or the test data input signal TDI. Next, the target device 130 performs a test operation in response to the JTAG signals and outputs the test output signal TDO to the test interface 120. The test output signal TDO is converted into a test signal TS by the test interface 120, and the test signal TS is sent to the host 110.

Continuing to refer to FIG. 1, the target device 130 may include a plurality of Intellectual Property (IP) blocks. The plurality of IP blocks may include a processor block 132, an alive block 133, and a switch block 131. The processor block 132 may be formed of at least one processor. For example, the processor block 132 may be formed of a central processing unit CPU in the ARM family, a digital signal processor DSP in the TEAK family, a combination of the CPU and DSP, or the like.

At a normal mode, the processor block 132 may support a debugging operation with respect to the target device 130. The normal mode indicates a mode where IP blocks, including the processor block 132, among the IP blocks in the target device 130 are powered. At a power saving mode, the processor block 132 is not powered. The power saving mode indicates a mode where IP blocks, including the processor block 132, among the IP blocks in the target device 130 are not powered.

It is possible to control a power and a clock applied to the plurality of IP blocks in the target device 130 at need. This is to reduce a power consumed by the target device 130. For example, if no command execution is requested from a user during a predetermined time, the processor block 132 may enter an idle state. In this case, the target device 130 enters a power saving mode, so that the processor block 132 is not powered.

The alive block 133 may be powered even at the power saving mode. The alive block 133 is capable of being realized variously according to designers so as to consume minimal power during the power saving mode. For example, the alive block 133 may include registers which store state information of a normal mode upon switching from the normal mode to the power saving mode. The alive block 133 provides state information of a previous normal mode to the processor block 132 upon returning to the normal mode from the power saving mode.

In an exemplary embodiment, the alive block 133 supports a debugging operation during the power saving mode. For this, the alive block 133 may include a test controller which controls a test operation at the power saving mode. For example, at the power saving mode, the test controller of the alive block 133 may control the test operation for debugging, e.g., only, the alive block 133. In another example, at the power saving mode, the test controller of the alive block 133 may control the test operation for debugging the IP blocks including the alive block 133.

Continuing to refer to FIG. 1, the switch block 131 may receive the converted test signal CTS from the test interface 120, and may selectively transfer the converted test signal CTS to either one of the processor block 132 and the alive block 133 in response to a power saving mode signal PSM. For example, when JTAG signals for debugging the target device 130 are used, the switch block 131 may transfer JTAG signals from the test interface 120, e.g., a test mode selection signal TMS, a test clock signal TCK and a test data input signal TDI, to either one of the processor block 132 and the alive block 133 in accordance with an activation state of the power saving mode signal PSM.

In detail, at the normal mode, the power saving mode signal PSM is inactivated. When the power saving mode signal PSM is inactivated, the switch block 131 transfers the converted test signal CTS from the test interface 120 to the processor block 132. That is, the first signal transfer path is formed by the switch block 131. Therefore, when JTAG signals for debugging the target device 130 are used, e.g., TMS, TCK, and TDI signals, the JTAG signals are transferred from the test interface 120 to the processor block 132 through the switch block 131.

Then, the processor block 132 performs a test operation using the received converted test signal CTS, e.g., the JTAG signals TMS, TCK, and TDI. After the test operation, a converted test signal CTS from the processor block 132 is sent to the test interface 120 through the switch block 131. In the event that JTAG signals for debugging the target device 130 are used, the processor block 132 performs a test operation using the JTAG signals TMS, TCK, and TDI. Then, the processor block 132 outputs as a test result a test data output signal TDO, which is transferred to the test interface 120 through the switch block 131.

Meanwhile, the power saving mode signal PSM is activated during a power saving mode. When the power saving mode signal PSM is activated, the switch block 131 transfers the converted test signal CTS from the test interface 120 to the alive block 133. That is, the signal transfer path is formed through the switch block 131.

In an exemplary embodiment, the power saving mode signal PSM is capable of being activated by the alive block 133. Alternatively, the power saving mode signal PSM may be activated by an interrupt controller (not shown).

In the event that JTAG signals for debugging the target device 130 are used during the power saving mode, e.g., JTAG signals TMS, TCK, and TDI, the JTAG signals may be transferred from the test interface 120 to the alive block 133 through the switch block 131.

Next, the alive block 133 performs the test operation in response to the received converted test signal CTS during the power saving mode. For example, the test controller of the alive block 133 controls, e.g., only, the test operation for debugging the alive block 133. In another example, the test controller of the alive block 133 controls the test operation for debugging IP blocks including the alive block 133.

After the test operation is performed, the alive block 133 outputs a converted test signal CTS, which is sent to the test interface 120 through the switch block 131. Accordingly, the test system 100 according to an exemplary embodiment of the inventive concept may perform the debugging operation without limitations even during the power saving mode. In particular, as the test system 100 according to an exemplary embodiment of the inventive concept supports the debugging operation at both the normal mode and the power saving mode, time and a costs required to develop the target device 130 may be reduced.

Figure 2:
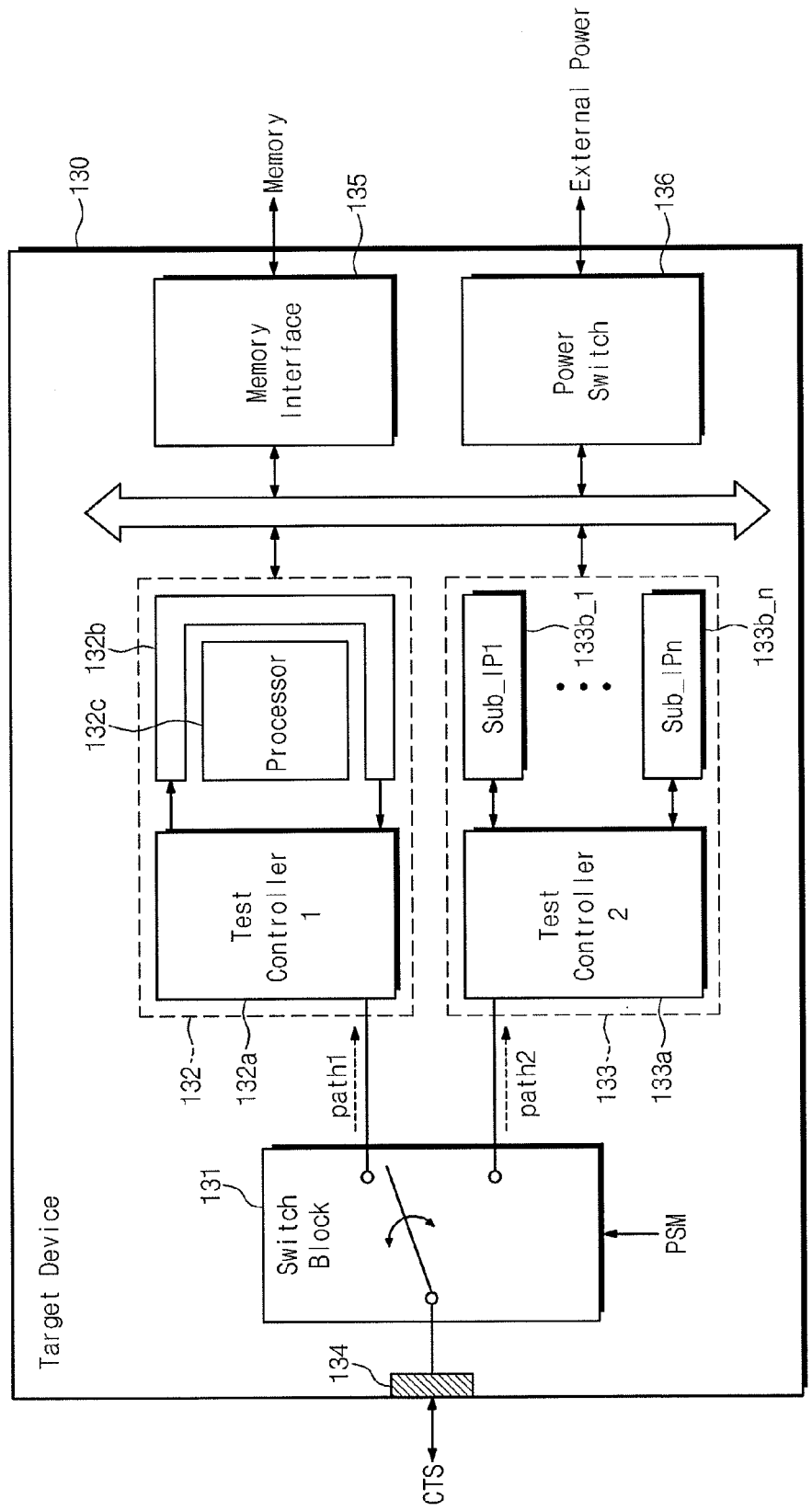
FIG. 2 illustrates a block diagram of a target device illustrated in FIG. 1.

FIG. 2 illustrates a detailed block diagram of the target device 130 illustrated in FIG. 1. Referring to FIG. 2, the target device 130 may include the switch block 131, the processor block 132, the alive block 133, an input/output terminal 134, a memory interface 135, and a power switch 136.

The input/output terminal 134 transfers the converted test signal CTS from the test interface 120 to the switch block 131. Further, the input/output terminal 134 transfers the converted test signal CTS from the switch block 131 to the test interface 120. In the event that JTAG signals for debugging the target device 130 are used, the input/output terminal 134 includes TMS, TCK, TDI, and TDO terminals.

Herein, the TDI terminal is a test data input terminal, and the TDO terminal is a test data output terminal. The TDI and TDO terminals are used to input and output data for boundary scanning. The TCK terminal transfers a clock signal to the first or second test controller 132a or 133a, upon testing. The TMS terminal transfers a test mode selection signal to the first or second test controller 132a or 133a.

The switch block 131 forms either the first signal transfer path between the input/output terminal 134 and the processor block 132 or the second signal transfer path between the input/output terminal 134 and the alive block 133, as discussed previously with reference to FIG. 1. In particular, at a normal mode, the switch block 131 forms the first signal transfer path between the input/output terminal 134 and the processor block 132 in response to an inactivated power saving mode signal PSM. At a power saving mode, the switch block 131 forms the second signal transfer path between the input/output terminal 134 and the alive block 133 in response to an activated power saving mode signal PSM.

The processor block 132 may include a first test controller 132a, a boundary scan cell 132b, and a processor 132c. The processor block 132 is powered at the normal mode to perform a test operation for debugging. The first test controller 132a controls an overall test operation at the normal mode.

In detail, in the event that JTAG signals are used for debugging the target device 130, the first test controller 132a receives the test mode selection signal TMS and the test clock signal TCK through the first signal transfer path. The first test controller 132a controls an overall test operation of the normal mode using the test mode selection signal TMS and the test clock signal TCK. In this case, a control operation of the first test controller 132a may be determined by a value of the test mode signal TMS at a low-to-high transition of the test clock signal TCK. Test data is synchronized with a low-to-high transition of the test clock signal TCK and is received from the TDI terminal through the first signal transfer path. Further, test data is synchronized with a high-to-low transition of the test clock signal TCK and is transferred to the TDO terminal through the first signal transfer path.

The boundary scan cell 132*b* may include scan registers. If JTAG signals are used for debugging the target device 130, the scan registers in the boundary scan cell 132*b* receive test data from the TDI terminal and shifts the received test data for boundary scanning. Data from the boundary scan cell 132*b* is transferred to the TDO terminal through the first test controller 132*a*.

The alive block 133 may include the second test controller 133*a* and a plurality of sub IP blocks, e.g., N sub IP blocks 133*b*_1 to 133*b*_*n*. The alive block 133 may be powered even at the power saving mode, so the alive block 133 may perform a test operation for debugging at the power saving mode.

The second test controller 133*a* controls an overall test operation at the power saving mode. For example, if JTAG signals for debugging the target device 130 are used, the second test controller 133*a* receives the test mode selection signal TMS, the test clock signal TCK, and the test data input signal TDI through the second signal transfer path.

In this case, the test operation of the power saving mode can be made variously according to configuration of the plurality of sub IP blocks 133*b*_1 to 133*b*_*n*. For example, the second test controller 133*a* may control the test operation for debugging of the alive block 133. In another example, the second test controller 133*a* may control the test operation for debugging IP blocks including the alive block 133. For example, the second test controller 133*a* responds to the received JTAG signals to control operations of analyzing a state machine of the target device 130, of analyzing a state according to a system control signal, and of testing application of a wake-up signal for switching to a normal mode from a power saving mode.

Continuing to refer to FIG. 2, the memory interface 135 provides an interface between a memory and the target device 130. For example, the memory may be a volatile memory, e.g., a DRAM, a SRAM, or the like. In another example, the memory may be a non-volatile memory, e.g., a flash memory, a PRAM, a RRAM, a FRAM, a MRAM, or the like.

The power switch 136 may be supplied with an external power. The power switch 136 may supply powers to the IP blocks of the target device 130. In case of the normal mode, e.g., the power switch 136 supplies power to the processor block 132 and/or the alive block 133. In case of the power saving mode, e.g., the power switch 136 interrupts the power supply to the processor block 132 and supplies power only to the alive block 133.

As described above, the alive block 133 according to an exemplary embodiment of the inventive concept may include the second test controller 133*a* for controlling the test operation at the power saving mode. Accordingly, it may be possible to perform the debugging operation even at the power saving mode. Further, as the switch block 131 enables switching between debugging operations of the normal mode and the power saving mode in response to a state of the power saving mode signal PSM, the test system 100 (referring to FIG. 1) may perform the debugging operation without limitations, e.g., even when a mode is switched to the power saving mode from the normal mode. As a result, it may be possible to save time and costs during development of the target device 130.

Figure 3:
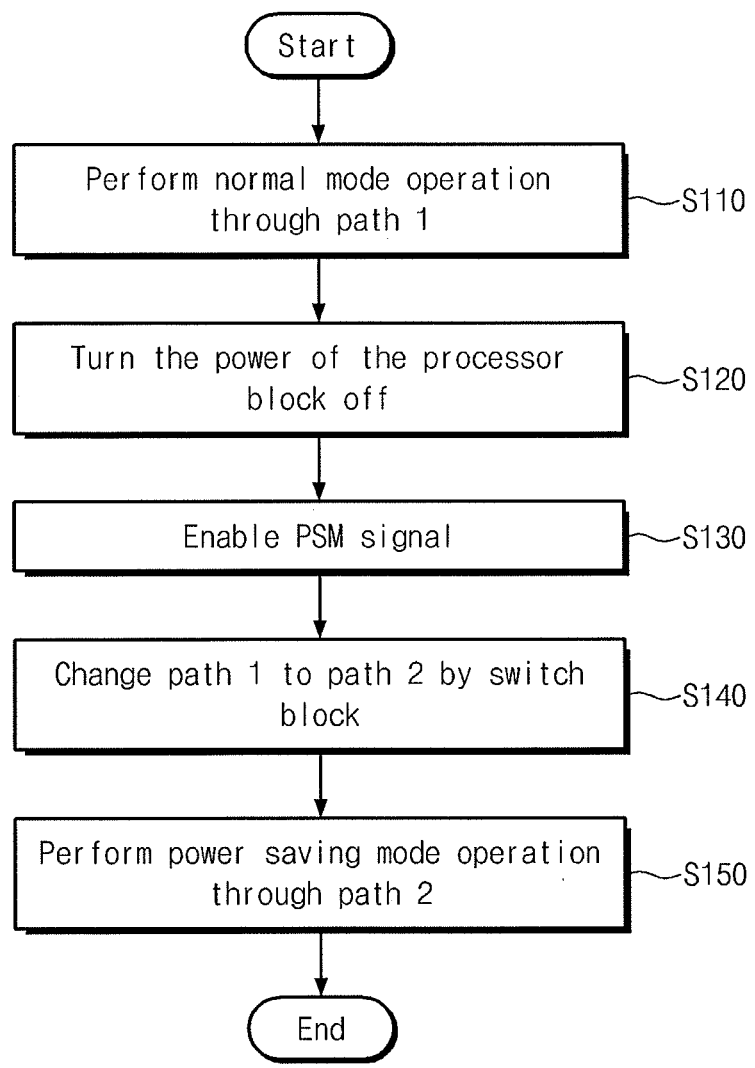
FIG. 3 illustrates a flow chart of a test operation of a target device illustrated in FIG. 2.

FIG. 3 illustrates a flow chart for describing a test operation of the target device 130 illustrated in FIG. 2. For ease of description, a test operation will be described under the assumption that a mode is switched to a power saving mode from a normal mode.

In operation S110, during a normal mode, a debugging operation may be performed through the first signal transfer path. That is, in case of the normal mode, the switch block 131 forms the first signal transfer path between the input terminal 134 and the processor block 132 in response to the inactivated power saving mode signal PSM. In this case, the processor block 132 may be powered and may perform a test operation for debugging of the normal mode.

In operation S120, the processor block 132 may not be powered. That is, the mode is switched to the power saving mode from the normal mode when the power of the processor block 132 is turned off, while the alive block 133 is powered. For example, the alive block 133 is capable of being powered at both the normal mode and the power saving mode. In another example, the alive block 133 is not powered at the normal mode, i.e., the alive block 133 is powered when the mode is switched to the power saving mode from the normal mode.

In operation S130, the power saving mode signal PSM may be activated. For example, the power saving mode signal PSM may be activated by the alive block 133. In another example, the power saving mode signal PSM may be activated by an interrupt controller (not shown). In this case, for example, the interrupt controller may simultaneously cut off power to the processor block 132 and activate the power saving mode signal PSM.

In operation S140, a signal transfer path of the converted test signal CTS may be switched to the second signal transfer path from the first signal transfer path. That is, the switch block 131 may form the second signal transfer path between the input/output terminal 134 and the alive block 133 in response to the activated power saving mode signal PSM.

In operation S150, a debugging operation of the power saving mode may be carried out through the second signal transfer path. That is, the alive block 133 may perform a test operation for debugging at the power saving mode. For example, the test controller 133*a* of the alive block 133 may control the test operation for debugging the alive block 133.

Figure 4:
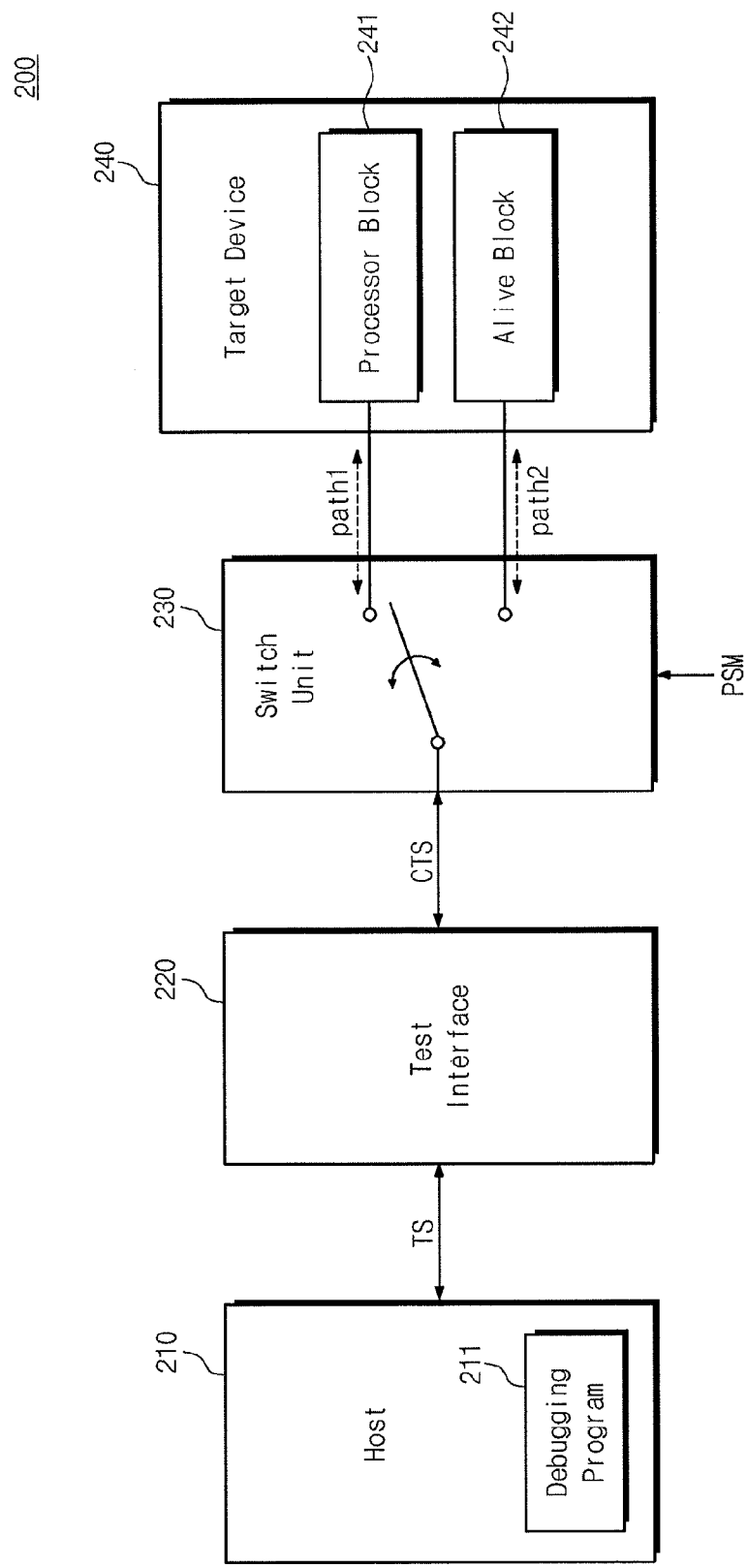
FIG. 4 illustrates a block diagram of a test system according to another exemplary embodiment of the inventive concept.

FIG. 4 illustrates a block diagram of a test system according to another exemplary embodiment of the inventive concept. A test system 200 in FIG. 4 is similar to that in FIG. 1 and, therefore, only a difference between the test systems 100 and 200 in FIGS. 1 and 4 will be more fully described below.

Referring to FIG. 1, a host 210 may include a debugging program 211 for testing a target device 240. The host 210 may transfer a test signal TS for testing the target device 240 through a test interface 220.

In detail, the test interface 220 may receive the test signal TS from the host 210 and may convert the test signal TS into a converted test signal CTS, which is sent to a switch unit 230. Elements 210 and 220 in FIG. 4 are similar to those in FIG. 1, and description thereof is thus omitted.

Unlike the switch unit 131 in FIG. 1, the switch unit 230 may be placed outside the target device 240. The switch unit 230 receives the converted test signal CTS from the test interface 220 and forms a signal transfer path for sending the converted test signal CTS to the target device 240.

For example, at a normal mode, the switch unit 230 forms the first signal transfer path between the test interface 220 and a processor block 241 in response to an inactivated power saving mode signal PSM. At a power saving mode, the switch unit 230 forms a second signal transfer path between the test interface 220 and an alive block 242 in response to an activated power saving mode signal PSM.

The target device 240 receives the converted test signal CTS from the switch unit 230 and performs a test operation for debugging in response to the received converted test signal CTS. For example, at the normal mode, the processor block 241 of the target device 240 receives the converted test signal CTS from the switch unit 230. That is, the converted test signal CTS is sent to the processor block 241 through the first signal transfer path. The processor block 241 performs a test operation for debugging of the normal mode using the converted test signal CTS. At the power saving mode, the alive block 242 of the target device 240 receives the converted test signal CTS from the switch unit 230. That is, the converted test signal CTS is transferred to the alive block 242 through the second signal transfer path. In this case, the alive block 242 performs a test operation for debugging of the power saving mode using the converted test signal CTS.

As described above, the switch unit 230 of the test system 200 in FIG. 4 is placed between the test interface 220 and the target device 240 unlike the switch block 131 in FIG. 1. Further, unlike the target device 130 in FIG. 1, the target device 240 in FIG. 4 may include two input/output terminals, which will be more fully described with reference to FIG. 5 below.

Figure 5:
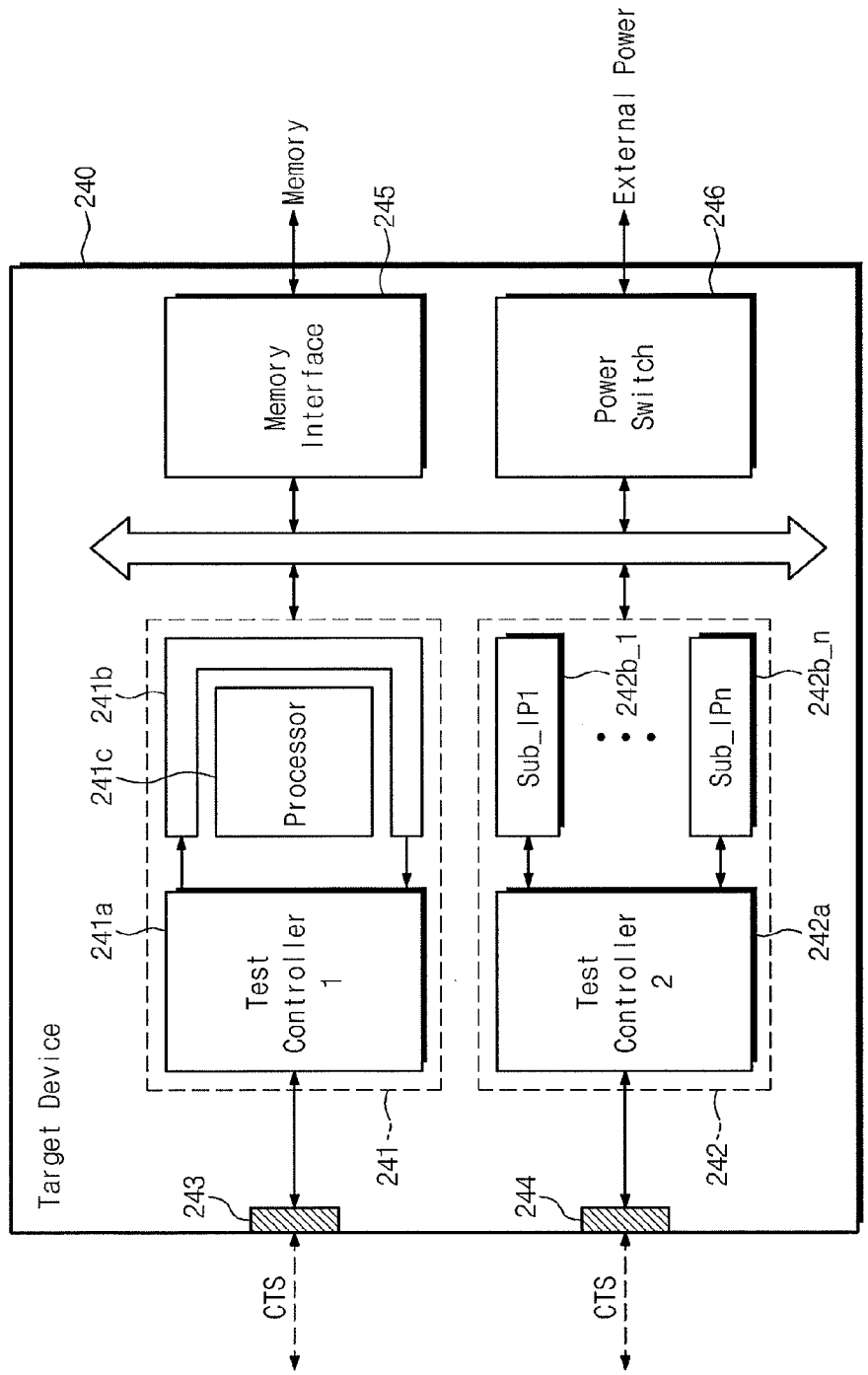
FIG. 5 illustrates a block diagram of a target device illustrated in FIG. 4.

FIG. 5 illustrates a detailed block diagram of the target device 240 illustrated in FIG. 4. The target device 240 in FIG. 5 is similar to that in FIG. 2, and the difference between the target devices 130 and 240 in respective FIGS. 1 and 5 will be more fully described below. Referring to FIG. 5, the target device 240 may include the processor block 241, the alive block 242, a first input/output terminal 243, a second input/output terminal 244, a memory interface 245, and a power switch 246.

As discussed above, the target device 240 may include the first and second input/output terminals 243 and 244 unlike the target device 130 in FIG. 1. This is because the target device 240 receives the converted test signal CTS from the switch unit 230 placed outside the target device 240, i.e., the switch unit 230 may be external with respect to the target device 240.

In particular, the first input/output terminal 243 receives the converted test signal CTS through the first signal transfer path at a normal mode. That is, at the normal mode, the switch unit 230 in FIG. 4 forms the first signal transfer path between the test interface 220 and the first input/output terminal 243 in response to an inactivated power saving mode signal PSM. In this case, the first input/output terminal 243 transfers the converted test signal CTS from the switch unit 230 to the processor block 241. Further, the first input/output terminal 243 sends the converted test signal CTS from the processor block 241 to the switch unit 230. If JTAG signals are used to debug the target device 240, the first input/output terminal 243 may include TMS, TCK, TDI, and TDO terminals.

The second input/output terminal 244 receives the converted test signal CTS through the second signal transfer path at the power saving mode. That is, in case of the power saving mode, the switch unit 230 forms the second signal transfer path between the test interface 220 and the second input/output terminal 244. In this case, the second input/output terminal 244 transfers the converted test signal CTS from the switch unit 230 to the alive block 242. Further, the second input/output terminal 244 transfers the converted test signal CTS from the alive block 242 to the switch unit 230. In the event that JTAG signals are used to debug the target device 240, the second input/output terminal 244 may include TMS, TCK, TDI, and TDO terminals.

The processor block 241 may include a first test controller 241a, a boundary scan cell 241b, and a processor 241c. The processor block 241 receives the converted test signal CTS for debugging from the first input/output terminal 243 at a normal mode. The first test controller 241a of the processor block 241 controls an overall test operation at the normal mode. The processor block 241 in FIG. 5 is similar to that in FIG. 2 and description thereof is thus omitted.

The alive block 242 may include the second test controller 242a and a plurality of, for example, N sub IP blocks 242b_1 to 242b_n. The alive block 242 receives the converted test signal CTS for debugging in case of a power saving mode. The second test controller 242a of the alive block 242 controls an overall test operation at a power saving mode. The alive block 242 in FIG. 5 is similar to that in FIG. 2 and description thereof is thus omitted.

As described above, the test system 200 according to another exemplary embodiment of the inventive concept supports the debugging operation at both the normal mode and the power saving mode. Therefore, time and costs used for developing the target device 240 may be substantially reduced.

Figure 6:
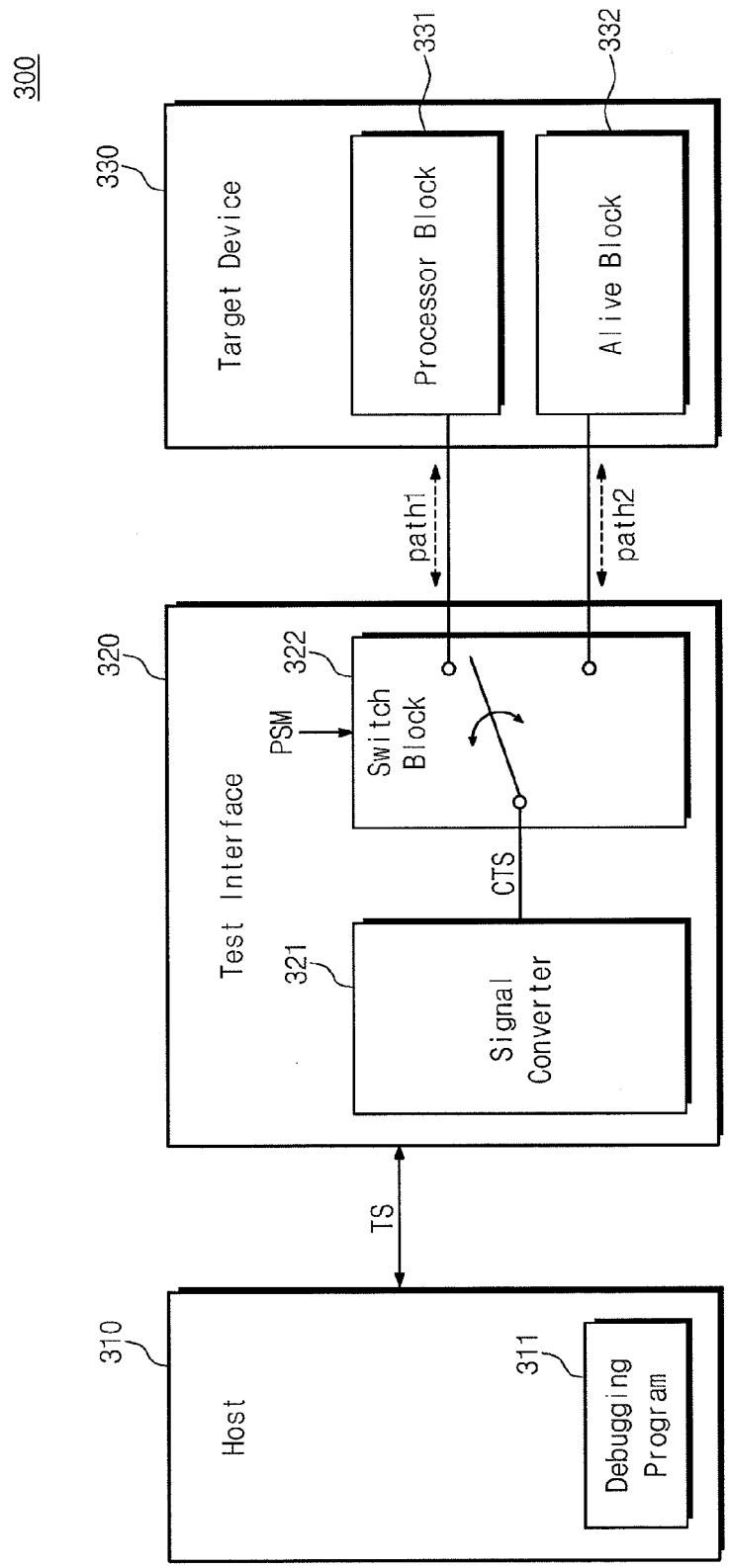
FIGS. 6 to 8 illustrate block diagrams of test systems according to other exemplary embodiments of the inventive concept.

FIG. 6 illustrates a block diagram showing a test system according to still another exemplary embodiment of the inventive concept. A test system 300 in FIG. 6 is similar to that in FIG. 4. A difference between the test systems in FIGS. 4 and 6 will be more fully described below. Referring to FIG. 6, the test system 300 may include a host 310, a test interface 320, and a target device 330.

The host 310 may include a debugging program 311 for testing the target device 330. The host 310 may transfer a test signal TS for testing the target device 330 to the test interface 320. The host 310 in FIG. 6 is similar to that in FIG. 4 and description thereof is thus omitted.

Unlike the test interface 220 in FIG. 4, the test interface 320 may include a signal converter 321 and a switch block 322. In other words, as illustrated in FIG. 6, the switch block 322 may be placed within the test interface 320, as opposed to being placed between and external to both the test interface 220 and the target device 240 in the configuration illustrated in FIG. 4. The signal converter 321 receives the test signal TS from the host 310. The signal converter 321 converts the test signal TS into a converted test signal CTS, which is sent to the switch block 322. The switch block 322 transfers the converted test signal CTS to the target device 330 through either one of the first and second signal transfer paths.

In case of the normal mode, the switch block 322 forms the first signal transfer path between the signal converter 321 and a processor block 331 in response to an inactivated power saving mode signal PSM. In this case, the converted test signal CTS is transferred to the processor block 331 through the first signal transfer path.

In case of the power saving mode, the switch block 322 forms the second signal transfer path between the signal converter 321 and an alive block 332 in response to an activated power saving mode signal PSM. In this case, the converted test signal CTS is transferred to the alive block 332 through the second signal transfer path.

The target device 330 receives the converted test signal CTS from the switch block 320. The target device 330 performs a test operation for debugging in response to the converted test signal CTS. The processor block 331 and alive block 332 in FIG. 6 are similar to the ones in FIG. 4 and, therefore, descriptions thereof are not repeated.

As described above, the test system 300 according to an exemplary embodiment of the inventive concept supports the debugging operation at both the normal mode and the power saving mode. Therefore, time and costs used to develop the target device 330 may be substantially reduced.

Meanwhile, a method of debugging a target device using JTAG signals is described as an example in FIGS. 1 to 6. However, a debugging method is not limited to this disclosure. For example, it may be possible to debug a target device using Inter Integrated Circuit (I2C) signals. In this case, the I2C signals include an SDA (serial data) line signal and an SCL (Serial Clock Line) signal. In another example, it may be possible to debug a target device using Serial Peripheral Interface (SPI) signals. That is, in FIGS. 1 to 6, a test interface converts a test signal TS into SPI signals, and a target device is debugged depending upon the SPI signals. In this case, the SPI signals include a Master Input Slave Output (MISO) signal, a Master Output Slave Input (MOSI) signal, a Serial Clock (SCK) signal, and a Select Slave (SS) signal.

In FIGS. 1 to 6, a test signal TS is converted into a converted test signal CTS, and a target device is debugged depending upon the converted test signal CTS. However, a debugging method is not limited to this disclosure. For example, it may be possible to debug a target device using a test signal TS provided from a host, which will be more fully described with reference to FIGS. 7 and 8.

Figure 7:
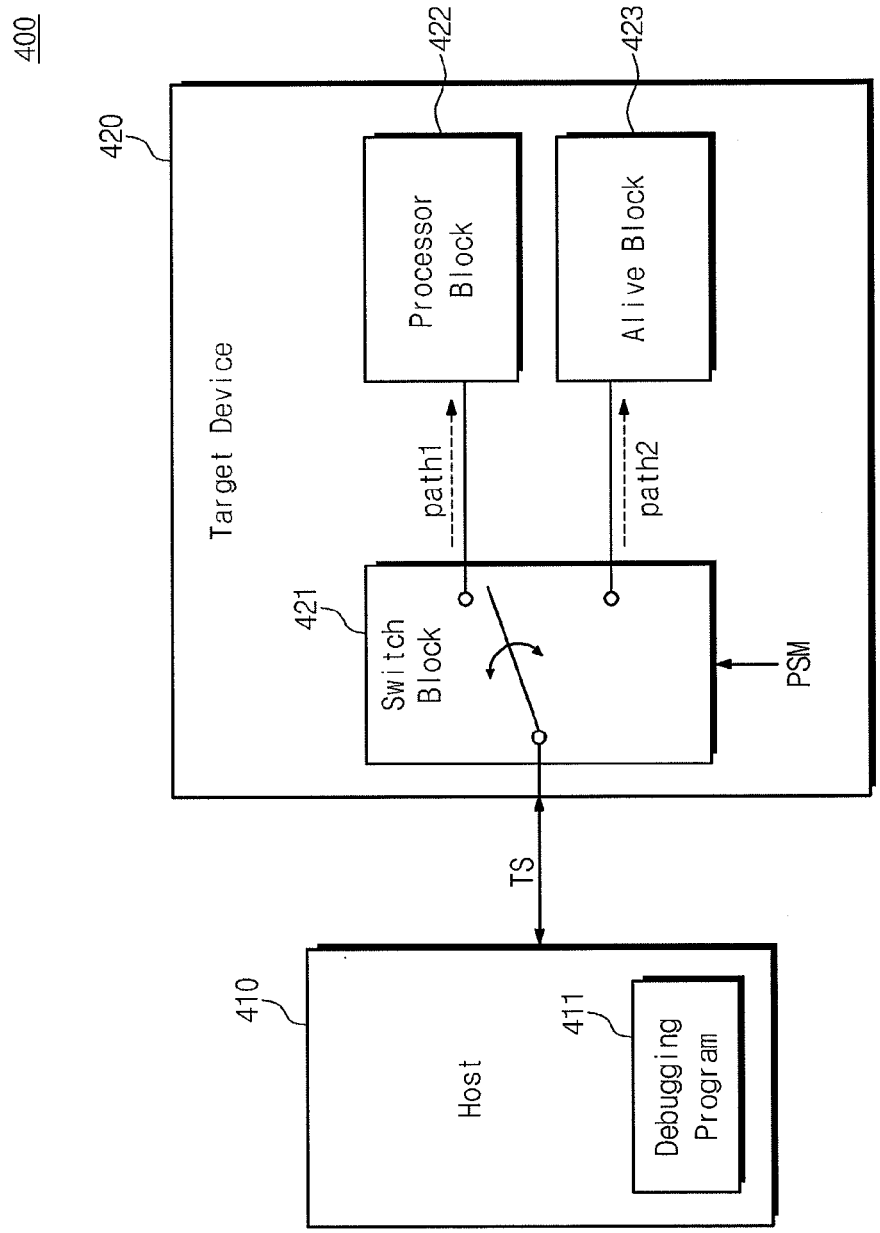

FIG. 7 illustrates a block diagram of a test system according to still another exemplary embodiment of the inventive concept. A test system 400 in FIG. 7 is similar to that in FIG. 1, with the exception of not having a test interface. Referring to FIG. 7, the test system 400 may include a host 410 and a target device 420.

As the test system 400 does not include a test interface, a test signal TS output from the host 410 is sent to the target device 420, and the target device 420 is debugged based on the test signal TS. For example, Universal Asynchronous receiver/transmitter (UART) signals can be used to debug the target device 420. The host 410, e.g., a personal computer, may include an UART device, in general. Accordingly, the host 410 may be capable of providing the UART signals as the test signal TS. In this case, the target device 420 may be debugged according to the UART signals. That is, unlike the test system 100 in FIG. 1, the test system 400 in FIG. 7 does not include a test interface independently. The target device 420 in FIG. 7 is similar to that in FIG. 1, and description thereof is thus omitted.

Figure 8:
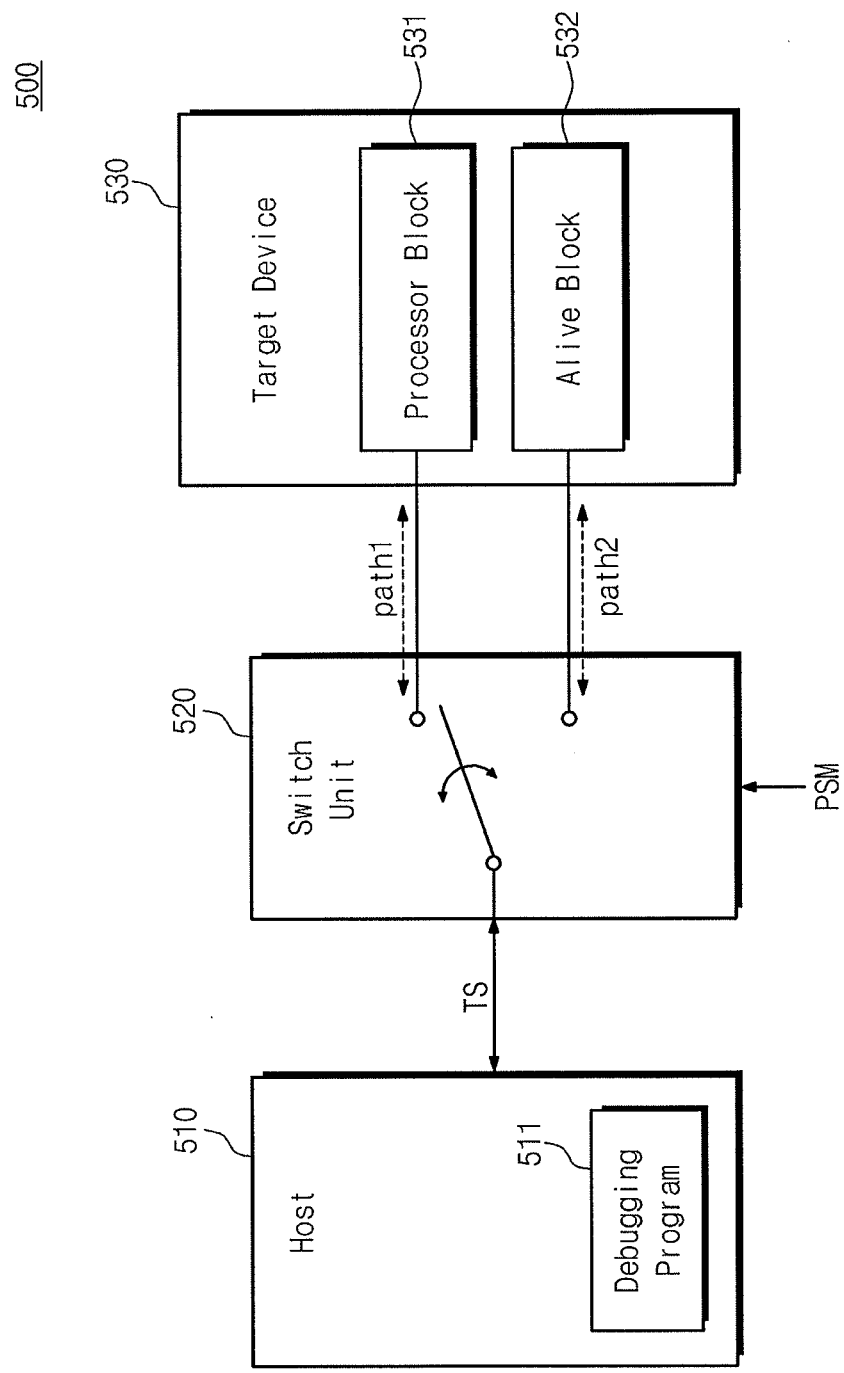

FIG. 8 illustrates a block diagram of a test system according to still another exemplary embodiment of the inventive concept. A test system 500 in FIG. 8 is similar to that in FIG. 4, with the exception of not having a test interface.

In particular, a test signal TS from a host 510 may be sent to a target device 530 through a switch unit 520. The target device 530 may be debugged according to the test signal TS, as described previously with reference to FIG. 7. That is, if UART signals are used to debug the target device 530, the test system 500 does not include a test interface independently. Elements 520 and 530 in FIG. 8 are similar to parallel elements in FIG. 4, and description thereof is thus omitted.

As described above, a test system according to exemplary embodiments of the inventive concept may support a debugging operation at both the normal mode and the power saving mode. Therefore, time and costs to develop the target device may be reduced.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A device comprising:
a first intellectual property (IP) block configured to be powered and to perform a debugging operation at a normal mode;
a second IP block configured to be powered to perform the debugging operation at a power saving mode; and
a switch block configured to form a first signal transfer path into the first IP block at the normal mode and to form a second signal transfer path into the second IP block at the power saving mode,
wherein the first IP block is configured not to be powered and not to perform the debugging operation while the second IP block is configured to be powered at the power saving mode.

2. The device as claimed in claim 1, further comprising:
a first test controller configured to debug the first IP block; and
a second test controller configured to debug the second IP block.

3. The device as claimed in claim 2, further comprising; an input/output terminal for interfacing a test signal, the first signal transfer path being formed between the input/output terminal and the first test controller and the second signal transfer path being formed between the input/output terminal and the second test controller.

4. The device as claimed in claim 3, wherein the test signal is JTAG interface signals.

5. The device as claimed in claim 3, wherein the input/output terminal transfers TCK, TMS, TDI, and TDO signal of JTAG interface.

6. The device as claimed in claim 2, wherein the second test controller is configured to control a state analyzing test.

7. The device as claimed in claim 1, wherein the first IP block includes at least one processor.

8. The device as claimed in claim 7, wherein the processor is ARM CPU.

9. The device as claimed in claim 7, wherein the processor is DSP.

10. The device as claimed in claim 7, wherein the first IP block includes a first test controller, a boundary scan cell, and a processor.

11. The device as claimed in claim 1, wherein the second IP block includes a plurality of sub-IP blocks.

12. The device as claimed in claim 1, wherein the power saving mode is idle mode of the device.

13. The device as claimed in claim 1, further comprising: a memory controller and a system bus coupled between the first and the second IP block and the memory controller.

14. The device as claimed in claim 13, wherein the memory controller is configured to connect a non-volatile memory.

15. The device as claimed in claim 1, further comprising: a power switch configured to supply a first power to the first IP block and a second power to the second IP block and configured not to supply one of the first power and the second power.

16. A system comprising:
a first test controller configured to control a first debugging operation of a first IP block;
a second test controller configured to control a second debugging operation of a second IP block and
a switch block configured to form a first signal transfer path into the first IP block at a normal mode and to form a second signal transfer path into the second IP block at a power saving mode, wherein the first IP block is configured to be powered and to perform the first debugging operation at a normal mode, the second IP block is configured to be powered to perform the second debugging operation at the power saving mode and wherein the first IP block is configured not to be powered and not to perform the first debugging operation while the second IP block is configured to be powered at the power saving mode.

17. The system as claimed in claim 16, wherein the first IP block includes at least one processor.

18. The system as claimed in claim 17, wherein the processor is ARM CPU.

19. The system as claimed in claim 16 further comprising a memory controller and a system bus coupled between the first and the second IP blocks and the memory controller.

20. The system as claimed in claim 19, wherein the memory controller is configured to connect a non-volatile memory.

21. The system as claimed in claim 16 further comprising a power switch configured to supply a first power to the first IP block and a second power to the second IP block and configured not to supply one of the first power and the second power.

22. A method of debugging a device having multiple operating power modes, the method comprising:
   setting a debugging path by selecting a first debugging path for debugging a device;
   debugging a first IP block in the device via the first debugging path coupled to a input/output terminal in a normal operation mode;
   turning off one of powers of the first IP block while a second IP block is powered in a power saving mode;
   switching the debugging path from the first debugging path to a second debugging path coupled to the input/output terminal; and
   debugging the second IP block in the device via the second debugging path in the power saving mode.

23. The method of debugging a device having multiple operating power modes as claimed in claim 22, further comprising deactivating a power saving mode signal at the normal operation mode and activating the power saving mode signal at the power saving mode.

24. The method of debugging a device having multiple operating power modes as claimed in claim 22, further comprising analyzing a state of the device.

25. The method of debugging a device having multiple operating power modes as claimed in claim 22, further comprising testing application of a wake-up signal for switching to the normal mode from the power saving mode.

26. The method of debugging a device having multiple operating power modes as claimed in claim 22, wherein the debugging path transfers a test signal by JTAG interface protocol.

27. The method of debugging a device having multiple operating power modes as claimed in claim 22, wherein the debugging path transfers a test signal by UART or I2C interface protocol.

28. The method of debugging a device having multiple operating power modes as claimed in claim 22 further comprising supplying the powers of the first and the second IP blocks via a power switch.

* * * * *